(12) United States Patent
Lee et al.

(10) Patent No.: US 9,240,511 B2
(45) Date of Patent: Jan. 19, 2016

(54) PHOTODETECTOR USING SURFACE PLASMON RESONANCE AND IMAGE SENSOR HAVING THE SAME

(71) Applicant: Korea Institute of Science and Technology, Seoul (KR)

(72) Inventors: Seung Yong Lee, Gwacheon-shi (KR); Jin Dong Song, Seoul (KR); So-Hye Cho, Seoul (KR); Jin Ock Park, Okcheon-gun (KR); Jong-Ku Park, Namyangju-shi (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/143,176

(22) Filed: Dec. 30, 2013

(65) Prior Publication Data

US 2015/0053980 A1    Feb. 26, 2015

(30) Foreign Application Priority Data

Aug. 20, 2013  (KR) .................. 10-2013-0098713

(51) Int. Cl.
| | | |
|---|---|---|
| H01L 31/02 | (2006.01) | |
| H01L 31/112 | (2006.01) | |
| H01L 31/0224 | (2006.01) | |
| H01L 31/0232 | (2014.01) | |
| H01L 31/09 | (2006.01) | |

(52) U.S. Cl.
CPC ........ *H01L 31/1126* (2013.01); *H01L 31/0224* (2013.01); *H01L 31/02327* (2013.01); *H01L 31/022408* (2013.01); *H01L 31/09* (2013.01)

(58) Field of Classification Search
CPC .................. H01L 31/1126; H01L 27/14638; H01L 31/035272
See application file for complete search history.

(56) References Cited

U.S. PATENT DOCUMENTS

| | | | |
|---|---|---|---|
| 7,420,225 B1 * | 9/2008 | Wanke et al. | ................. 257/192 |
| 8,088,484 B2 | 1/2012 | Ueno et al. | |
| 8,236,421 B2 | 8/2012 | Ueno et al. | |

(Continued)

FOREIGN PATENT DOCUMENTS

| | | |
|---|---|---|
| JP | 2003-279476 A | 10/2003 |
| JP | 2009-58474 A | 3/2009 |

(Continued)

OTHER PUBLICATIONS

Tang, et al. "Nanometer-scale germanium photodetector enhanced by a near-infrared dipole antenna", Nature Photonics, V2, (2008): p. 226-229.

(Continued)

*Primary Examiner* — Roy Potter
*Assistant Examiner* — Paul Patton
(74) *Attorney, Agent, or Firm* — NSIP Law

(57) ABSTRACT

Disclosed is a photodetector including an electrically conductive substrate, a first electrode formed on the substrate, a second electrode disposed to be spaced apart from the first electrode, a plasmonic nanostructure positioned between the first electrode and the second electrode and having surface plasmon resonance, and a resistance measuring device or an electrical conductivity measuring device connected to the first electrode and the second electrode.

10 Claims, 9 Drawing Sheets

(56) References Cited

U.S. PATENT DOCUMENTS

| | | | |
|---|---|---|---|
| 2008/0280776 A1* | 11/2008 | Bashir et al. | 506/9 |
| 2009/0243589 A1* | 10/2009 | Blumberg | 324/95 |
| 2010/0067016 A1* | 3/2010 | Ueno et al. | 356/445 |
| 2011/0198499 A1 | 8/2011 | Park et al. | |
| 2011/0215298 A1 | 9/2011 | Kim et al. | |
| 2011/0309336 A1* | 12/2011 | Shin et al. | 257/29 |
| 2012/0100626 A1* | 4/2012 | Niskanen et al. | 436/149 |

FOREIGN PATENT DOCUMENTS

| | | |
|---|---|---|
| JP | 2011-171519 A | 9/2011 |
| KR | 10-2013-0015794 A | 2/2013 |
| KR | 10-1293443 B1 | 7/2013 |

OTHER PUBLICATIONS

Knight, et al. "Photodetection with active optical antennas." Science 332.6030 (2011): 702-704.

* cited by examiner

PHOTODETECTOR USING SURFACE PLASMON RESONANCE AND IMAGE SENSOR HAVING THE SAME

CROSS-REFERENCE TO RELATED APPLICATION

This application claims priority to and the benefit of Korean Patent Application No. 10-2013-0098713 filed in the Korean Intellectual Property Office on Aug. 20, 2013, the entire contents of which are incorporated herein by reference.

BACKGROUND OF THE INVENTION (a) Field

The present invention relates to a photodetector and an image sensor. Particularly, the present invention relates to a photodetector using surface plasmon resonance and an image sensor.

(b) Description of the Related Art

A known photodetector senses light by using a semiconductor device. A wavelength region of sensed light is determined according to band gap energy of the used semiconductor device. That is, light having energy that is higher than a band gap of the semiconductor device excites electrons of a valence band to a conduction band to change an electrical characteristic of the semiconductor device. Thereby, light is sensed. Accordingly, light having energy that is lower than band gap energy of the semiconductor device is not capable of being sensed. Therefore, in the case of silicon, it is impossible to sense light having a wavelength that is larger than 1.1 µm in an infrared light region.

Band gap energy needs to be adjusted to change the wavelength of light capable of being sensed. A method for doping an impurity or a method for using a semiconductor device of another element has been adopted to adjust band gap energy.

In the known photodetector, when a semiconductor forming a device receives light having energy of a band gap thereof or more, a photocurrent is generated in the semiconductor device, and light is detected by using the photocurrent.

Recently, there have been attempts to use a plasmon resonance phenomenon to detect light. In ["Nanometer-scale germanium photodetector enhanced by a near-infrared dipole antenna", Nature Photonics, V2, pp 226-229, 2008] as a paper presented by Tang et al. in Nature Photonics and U.S. Patent Laid-Open Publication 2011/0198499 as a related application, there is an attempt to detect light by positioning a metal nano-rod type of structure and a dipole antenna over and under a Si or Ge semiconductor to increase an avalanche gain operation effect to measure a photocurrent. In this case, the paper describes that the dipole antenna acts to focus light on the semiconductor. Further, ["Photodetection with active optical antennas", Science, V332, pp 702-704, 2011] as a paper presented by Knight et al. in Science describes that an n-type silicon and an ITO film form a Schottky diode, a gold nano-rod periodically formed therebetween is excited by incident light to form hot electrons, and a portion of the hot electrons contributes to a photocurrent to detect light.

However, in the paper and the patent of Tang et al., light is detected still by using the photocurrent of the semiconductor device. Further, in the paper of Knight et al., the semiconductor device is not used, but light is detected by using the photocurrent flowing between ITO-Au—Si structures. In this case, the photocurrent is shown to be at a pA or nA level.

As described above, the known photodetector is based on the photocurrent excited by light. Accordingly, the wavelength of detected light is inevitably limited.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a photodetector detecting lights having various wavelengths, and an image sensor.

An exemplary embodiment of the present invention provides a photodetector including an electrically conductive substrate. A first electrode formed on the substrate, a second electrode disposed to be spaced apart from the first electrode, a plasmonic nanostructure positioned between the first electrode and the second electrode and having surface plasmon resonance, and a resistance measuring device or an electrical conductivity measuring device connected to the first electrode and the second electrode.

The plasmonic nanostructure may cause surface plasmon resonance when light is incident, and change electrical conductivity of the substrate according to the surface plasmon resonance.

The plasmonic nanostructure may be an assembly of a plurality of plasmonic nanoparticles and may be formed by using lithography or by assembling.

The substrate may be formed of a semiconductor, and the photodetector may be formed of a field effect transistor controlling a flow of a current by light incident on the plasmonic nanostructure.

A heterogeneous doping region on which a material that is different from a doping material forming the substrate is doped may be formed at a portion adjacent to the first electrode and the second electrode, and an insulating thin film may be formed between the plasmonic nanostructure and the substrate.

The substrate may be formed of a conductive metal oxide, and may be formed of a silicon on insulator (SOI) substrate.

Further, the plasmonic nanostructure may be disposed to extend in a direction crossing a length direction of the first electrode and the second electrode, and may be disposed to be perpendicular to the substrate.

The plasmonic nanostructure may have any one structure of hexahedron type, cylinder type, rod type, and ring type structures. The plasmonic nanostructure may have a plurality of structures of the hexahedron type, cylinder type, rod type, and ring type structures.

An image sensor according to another exemplary embodiment of the present invention may include a plurality of the aforementioned photodetectors. The image sensor may be doped by using various structures to have a substrate structure of a field effect transistor.

In a photodetector according to the present invention, an electrical field occurring during surface plasmon resonance of a plasmonic nanostructure and a carrier induced by the electrical field to a substrate to be focused, that is, a carrier mirror image, are used. The carrier mirror image changes electrical conductivity of the substrate. Accordingly, it is possible to detect light by measuring electrical conductivity of the substrate.

Further, it is possible to easily control a surface plasmon resonance frequency of the plasmonic nanostructure by changing a type of metal and a shape factor such as an aspect ratio of a metal. Therefore, unlike a photodetector using a semiconductor having a specific band gap according to a material, it is possible to easily detect lights having various frequencies ranging from a visible light region to an infrared light region by changing the plasmonic nanostructure even though the same material is used.

DETAILED DESCRIPTION

Figure 1:
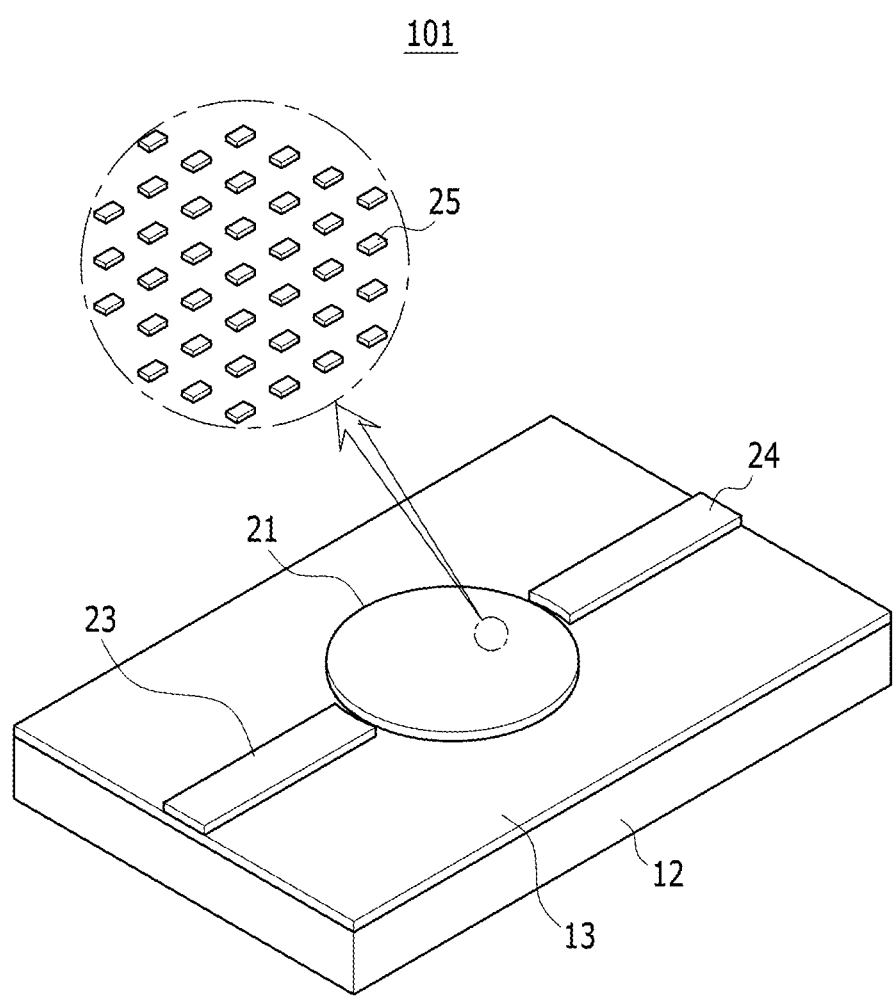
FIG. 1 is a perspective view showing a photodetector according to a first exemplary embodiment of the present invention.

Hereinafter, exemplary embodiments of the present invention will be described in detail with reference to the accompanying drawings so that those skilled in the art may easily practice the present invention. As those skilled in the art would realize, the described embodiments may be modified in various different ways, all without departing from the spirit or scope of the present invention. In addition, the drawings and description are to be regarded as illustrative in nature and not restrictive. Like reference numerals designate like elements throughout the specification. Further, in the present invention, the word "~on" means positioning on or below a contact surface, but does not essentially mean positioning on the upper side of the contact surface based on a gravity direction.

Figure 2:
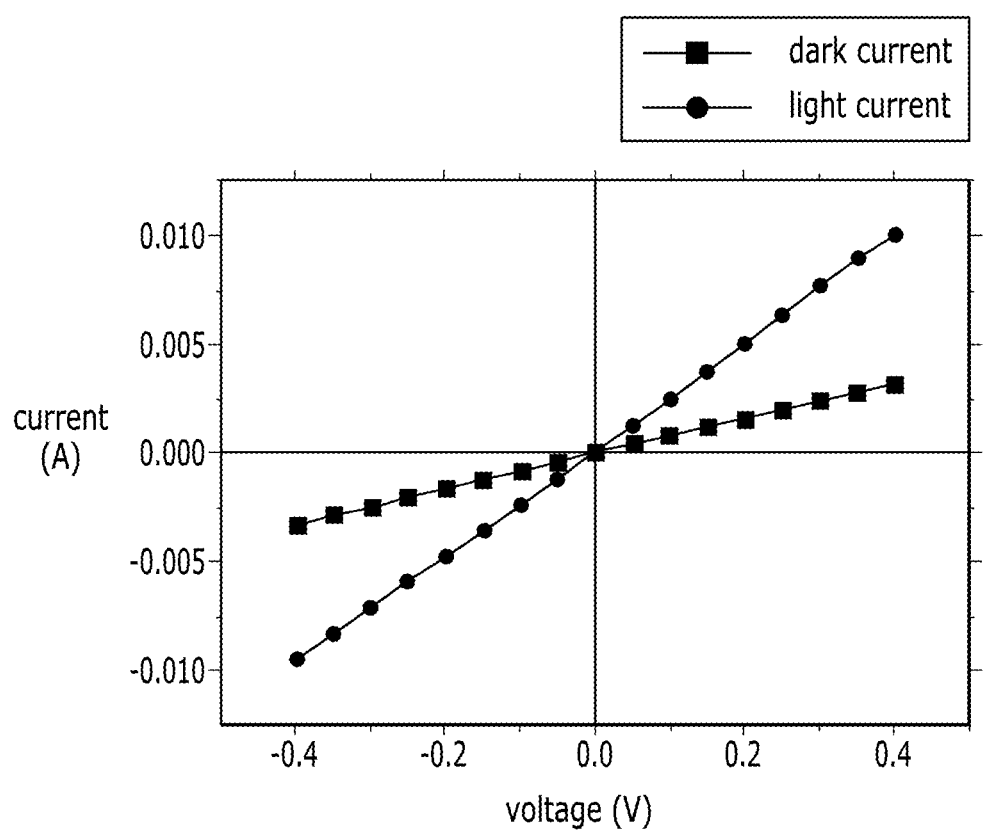
FIG. 2 is a schematic diagram showing the photodetector according to the first exemplary embodiment of the present invention.

FIG. 1 is a perspective view showing a photodetector according to a first exemplary embodiment of the present invention, and FIG. 2 is a schematic diagram showing the photodetector according to the first exemplary embodiment of the present invention.

Referring to FIGS. 1 and 2, a photodetector 101 according to the present exemplary embodiment includes a base 12, a substrate 13 formed on the base 12, a first electrode 23 and a second electrode 24 formed on the substrate 13, and a plasmonic nanostructure 21 disposed between the first electrode 23 and the second electrode 24.

The base 12 is formed of a hard plate such as glass and supports the substrate 13. Further, the base 12 may be omitted according to hardness of the substrate 13. The substrate 13 is formed of an electrically conductive material through which electricity is well transported. The substrate 13 may be formed of a semiconductor or a conductor. The substrate 13 may have a structure where an insulator thin film is formed on the substrate having conductivity.

When the substrate 13 is formed of the semiconductor, the substrate 13 may be formed of a silicon wafer. The substrate 13 may be formed of a conductive metal oxide such as ITO, AZO, and IZO, or a metal thin film having high resistance. The substrate 13 may be formed as a silicon on insulator (SOI) substrate. Electrical conductivity of the substrate 13 is not changed when the substrate 13 receives light. The substrate is sufficient as long as the substrate is formed of the semiconductor or the conductor, and a material thereof is not particularly limited.

The first electrode 23 and the second electrode 24 are formed of a metal having excellent electrical conductivity, such as aluminum (Al), copper (Cu), titanium (Ti), silver (Ag), and gold (Au). The first electrode 23 and the second electrode 24 are disposed on the substrate and spaced apart from each other with the plasmonic nanostructure 21 interposed therebetween. Accordingly, an electrical characteristic of the substrate changed by the plasmonic nanostructure 21 may be measured.

The plasmonic nanostructure 21 is formed of a thin film including plasmonic nanoparticles. In the present exemplary embodiment aiming at detection of visible light, the plasmonic nanoparticles may be formed of a metal having a negative dielectric constant in a visible light region to cause a plasmon resonance phenomenon, such as gold (Au), silver (Ag), and copper (Cu).

Figure 3:
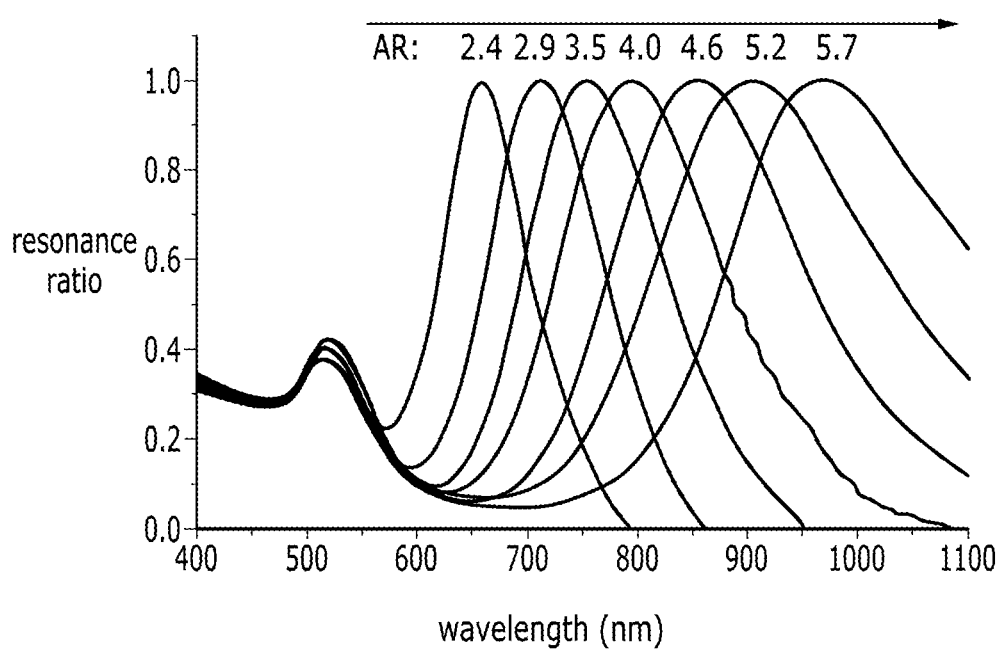
FIG. 3 is a graph showing a surface plasmon resonance frequency tuning according to an aspect ratio of a plasmonic nanostructure.

FIG. 3 is a graph showing surface plasmon resonance frequency tuning according to an aspect ratio of the plasmonic nanostructure. In FIG. 3, a rectangular plasmonic nanostructure 21 formed of gold (Au) is used. As shown in FIG. 3, a wavelength at which plasmon resonance occurs may be adjusted by changing the aspect ratio of the plasmonic nanostructure 21. Accordingly, light having a desired wavelength may be detected by changing the shape of the plasmonic nanostructure 21. As shown in FIG. 3, when the aspect ratio of the plasmonic nanostructure 21 is reduced, light having a small wavelength may be detected. When the aspect ratio of the plasmonic nanostructure 21 is increased, light having a large wavelength may be detected.

Figure 4:
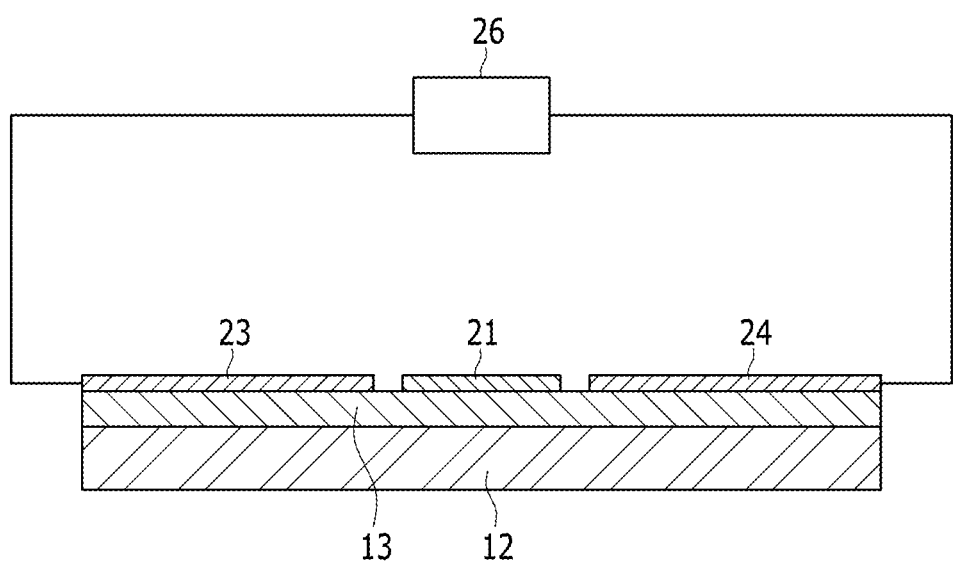
FIG. 4 is a current-voltage line diagram of the photodetector according to the first exemplary embodiment of the present invention.

FIG. 4 is a current-voltage line diagram of the photodetector according to the first exemplary embodiment of the present invention.

FIG. 4 is a graph showing a current and a voltage measured by radiating light after the thin film type plasmonic nanostructure 21 is formed on the substrate 13 formed of ITO. Herein, the substrate 13 is formed to have sheet resistance of 4.5 Ω/□.

The plasmonic nanostructure 21 is formed of an assembly including a plurality of plasmonic nanoparticles 25. Further, the plasmon nanostructure 21 is formed of a thin film. The plasmon nanostructure 21 is formed by applying 2 µl of a suspension solution including the plasmonic nanoparticles 25 formed of Ag on the substrate. The plasmon nanostructure 21 is formed of a circular thin film having a diameter of 1 to 2 mm (the thin film is not dense). In this case, the plasmonic nanoparticles 25 may have a shape of a hexahedron, a cylinder, a rod, a disk, a pillar, a ring, or a combination of a plurality of shapes.

As shown in FIG. 2, a light current as a current when light is radiated has a value that is larger than that of a dark current when there is no light at the same voltage. In FIG. 2, slopes of the light current and the dark current are resistances of the substrate 13. Resistance of the substrate 13 is 41.0 Ω when light is radiated, and resistance of the substrate 13 is 123.5 Ω when light is not radiated. That is, resistance of the substrate 13 when light is radiated is reduced to a level of ⅓ as compared to resistance when light is not radiated. A reduction in resistance of the substrate 13 means a change in electrical conductivity of the substrate 13. Accordingly, when light is incident, electrical conductivity of the substrate 13 is changed due to the plasmon resonance occurring in the plasmonic nanostructure 21.

When light is incident, an electron cloud of the plasmonic nanostructure 21 resonates, and a strong electrical field is induced on a surface of the plasmonic nanostructure 21. Carriers are guided to the substrate 13 and a symmetric carrier mirror image is formed due to the induced strong electrical field. That is, the carriers in the substrate 13 are focused in a symmetric form with the electron cloud of the plasmonic nanostructure 21. Focusing of the carriers locally increases a carrier concentration to locally change electrical conductivity of the substrate 13.

Accordingly, when light is incident, electrical conductivity is increased due to an increase in carrier concentration at a portion of the substrate 13 adjacent to the plasmonic nanostructure 21. The increase in electrical conductivity means that light plasmon-resonating with the plasmonic nanostructure and having a specific wavelength is incident. Accordingly, the presence of light may be detected through the change in electrical conductivity of the substrate 13.

Further, as described above, the surface plasmon resonance frequency of the plasmonic nanostructure 21 may be adjusted by changing a type of metal. The surface plasmon resonance frequency may be easily tuned from several hundreds of nanometers to several thousands of nanometers by controlling a shape factor such as the aspect ratio, a size, and a diameter using the same metal.

As shown in FIG. 4, the photodetector 101 according to the present exemplary embodiment further includes a measuring device 26 connected to the first electrode 23 and the second electrode 24 to measure the change in electrical conductivity of the substrate 13. The measuring device 26 can be a resistance measuring device or an electrical conductivity measuring device.

The measuring device 26 measures electrical conductivity or resistance of the substrate 13 to generate a signal regarding the presence of light having the wavelength to be detected. The measuring device 26 compares resistance or electrical conductivity of the substrate 13 when there is no light and the measured resistance or electrical conductivity to judge whether resistance is reduced or electrical conductivity is increased, thereby judging the presence of light. The change in electrical conductivity of the substrate 13 may be easily obtained from a change in resistance.

As described above, the photodetector 101 according to the present exemplary embodiment does not detect light having a specific wavelength through measurement of the photocurrent like the prior art, but detects light having a specific wavelength by measuring the change in resistance of the substrate 13. Hereinafter, a method for detecting light by using the photodetector according to the present first exemplary embodiment will be described.

The method for detecting light according to the present first exemplary embodiment includes a resonance step of allowing the plasmonic nanostructure 21 to plasmon-resonate by incident light, and a detection step of detecting the presence of light by measuring the change in electrical conductivity of the substrate 13 by the plasmon resonance.

During the resonance step, when light having the wavelength in a predetermined range is incident, the plasmonic nanostructure 21 surface plasmon-resonates to generate an electromagnetic wave. During the resonance step, the electromagnetic wave forms the carrier mirror image on the substrate 13. Accordingly, the carriers are focused on the portion of the substrate 13 adjacent to the plasmonic nanostructure 21. Resistance of the portion on which the carriers are focused is lower than that of another portion.

During the detection step, the presence of light is detected by measuring resistance of the substrate 13 by using the measuring device connected to the first electrode 23 and the second electrode 24 disposed to be spaced apart from each other with the plasmonic nanostructure 21 interposed therebetween.

Figure 5:
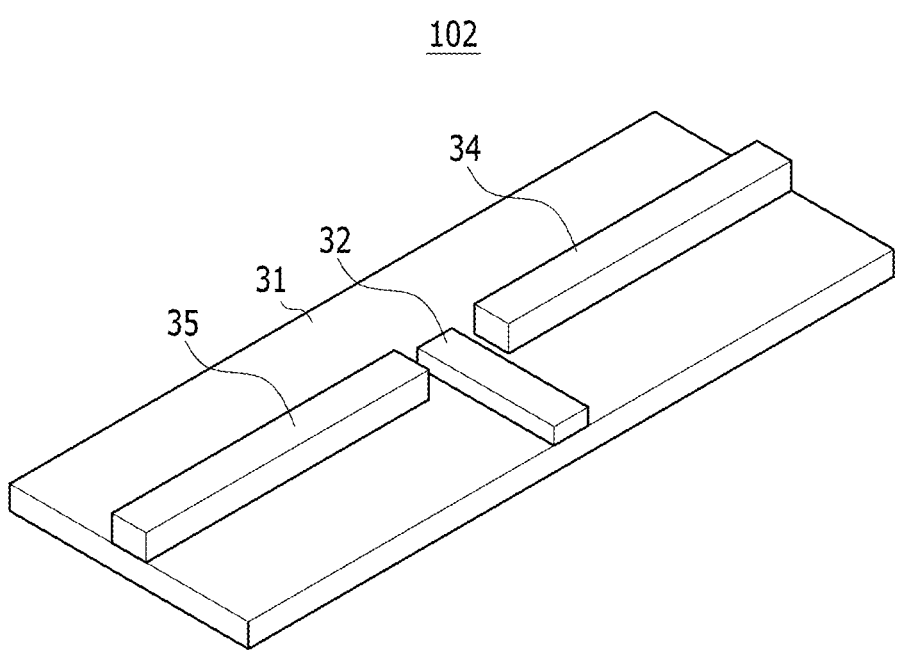
FIG. 5 is a perspective view showing a photodetector according to a second exemplary embodiment of the present invention.

FIG. 5 is a perspective view showing a photodetector according to a second exemplary embodiment of the present invention.

Referring to FIG. 5, a photodetector 102 according to the present exemplary embodiment includes a substrate 31, a first electrode 34 and a second electrode 35 formed on the substrate 31, and a plasmonic nanostructure 32 disposed between the first electrode 34 and the second electrode 35.

The substrate 31 may be formed of a silicon wafer. The first electrode 34 and the second electrode 35 may be formed of a metal having high conductivity, such as gold, silver, and copper. The first electrode 34 and the second electrode 35 are formed to extend in the same direction, and are disposed to be spaced apart from each other by an interval.

The plasmonic nanostructure 32 has a rod shape and a length that is larger than a height. The plasmonic nanostructure 32 is disposed to extend in a direction crossing a length direction of the first electrode 34 and the second electrode 35. However, the present invention is not limited thereto, and the plasmonic nanostructure 32 may have various shapes such as a ring, a disk, a rod, a polyhedral pillar, and a cylinder.

When the width of the plasmonic nanostructure 32 is fixed and the length is changed, the aspect ratio of the plasmonic nanostructure 32 is changed. Accordingly, the plasmon resonance frequency of the plasmonic nanostructure 32 is changed. As described above, when the length of the plasmonic nanostructure 32 is changed, the wavelength of light capable of being detected may be changed.

The rod-shaped plasmonic nanostructure 32 may detect only light of a specific polarization direction according to disposal direction. That is, light having the same polarization direction as the length direction of the plasmonic nanostructure 32 easily activates the carriers of the plasmonic nanostructure 32 to generate the surface plasmon resonance. On the other hand, light having the polarization direction perpendicular to the length direction of the plasmonic nanostructure 32 does not activate the carriers of the plasmonic nanostructure 32. Accordingly, the surface plasmon resonance is not generated. Therefore, only light having a specific polarization direction may be detected.

Figure 6:
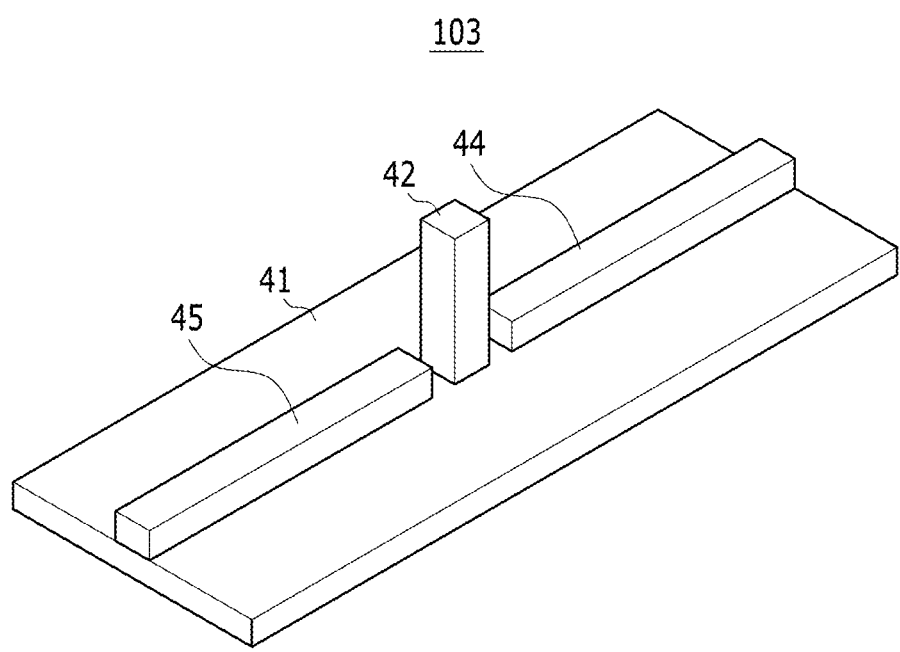
FIG. 6 is a perspective view showing a photodetector according to a third exemplary embodiment of the present invention.

FIG. 6 is a perspective view showing a photodetector according to a third exemplary embodiment of the present invention.

Referring to FIG. 6, a photodetector 103 according to the present exemplary embodiment includes a substrate 41, a first electrode 44 and a second electrode 45 formed on the substrate 41, and a plasmonic nanostructure 42 disposed between the first electrode 44 and the second electrode 45.

The first electrode 44 and the second electrode 45 are formed to extend in a straight line, and are disposed to be spaced apart from each other by an interval. The plasmonic nanostructure 42 has a rod shape, and is disposed to be perpendicular to the substrate 41. That is, the plasmonic nanostructure 42 is formed so that a height is larger than a width and a length. Further, the width and the length of the plasmonic nanostructure 42 may be the same. When the height of the rod-shaped plasmonic nanostructure 42 is adjusted, the wavelength of light as a detection target may be adjusted.

Figure 7:
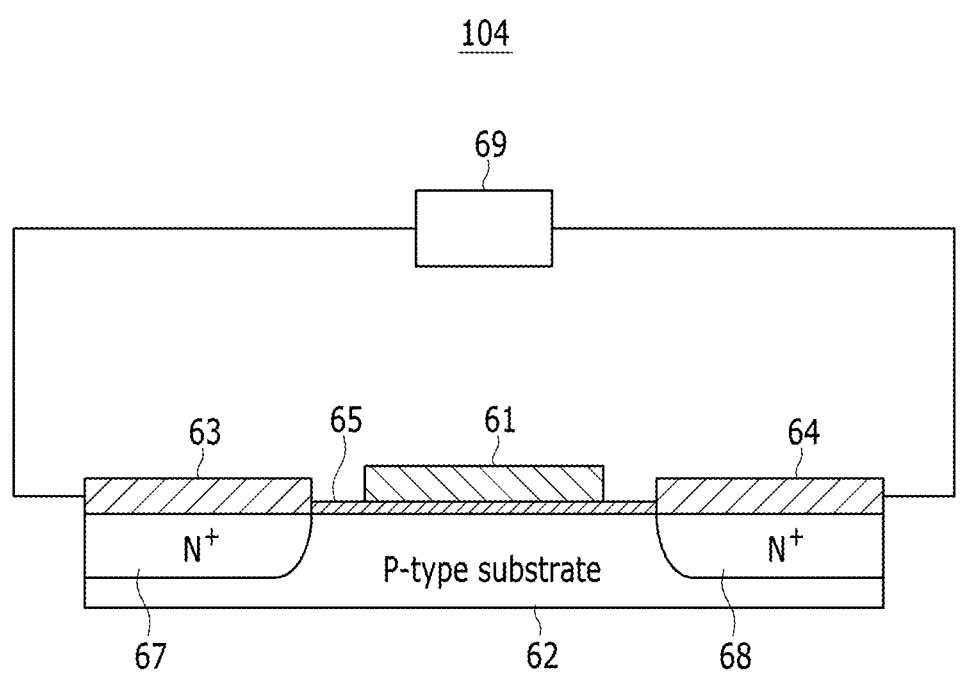
FIG. 7 is a cross-sectional view showing a photodetector according to a fourth exemplary embodiment of the present invention.

FIG. 7 is a cross-sectional view showing a photodetector according to a fourth exemplary embodiment of the present invention.

Referring to FIG. 7, a photodetector 104 according to the present exemplary embodiment includes a substrate 62, a first electrode 63 and a second electrode 64 formed on the substrate 62, and a plasmonic nanostructure 61 disposed between the first electrode 63 and the second electrode 64.

The substrate 62 is formed of a P-type semiconductor such as a silicon wafer. However, this is illustrative and the substrate 62 may be formed of an N-type semiconductor. The first electrode 63 and the second electrode 64 may be formed of a metal having high conductivity, such as gold, silver, and copper. The first electrode 63 and the second electrode 64 are disposed to be spaced apart from each other by an interval. A measuring device 69 is provided to be connected to the first electrode 63 and the second electrode 64.

The plasmonic nanostructure 61 is disposed between the first electrode 63 and the second electrode 64 and has a plate shape. An insulating thin film 65 is formed between the plasmonic nanostructure 61 and the substrate 62. Further, a heterogeneous doping region 67 is formed between the first electrode 63 and the substrate 62, and a heterogeneous doping region 68 is formed between the second electrode 64 and the substrate 62. The heterogeneous doping regions 67 and 68 are formed by doping an N-type semiconductor material on the substrate 62. Since the substrate 62 is formed of a P-type semiconductor, a P-type semiconductor material is doped on the substrate. The heterogeneous doping regions 67 and 68 are formed of regions doped with a material that is different from a known doping material.

Accordingly, when light is incident, electrical conductivity is increased due to an increase in carrier concentration at a portion of the substrate 62 adjacent to the plasmonic nanostructure 61. Therefore, a flow of a current is formed between the first electrode 63 and the second electrode 64. The presence of light may be detected through a change in electrical conductivity of the substrate 62.

Electrical conductivity is changed due to a change by an electrical field formed by charges locally focused on the plasmonic nanostructure 61. Accordingly, even though a thin insulator is present between the plasmonic nanostructure 61 and the substrate 62, the change in electrical conductivity of the substrate 62 may be confirmed.

As described above, according to the present exemplary embodiment, the first electrode 63 becomes a source electrode, the second electrode 64 becomes a drain electrode, and the plasmonic nanostructure 61 becomes a gate electrode. However, unlike a general field effect transistor, the flow of the current is not controlled by a voltage of the gate electrode, but is controlled by light that is incident on the plasmonic nanostructure 61.

Figure 8:
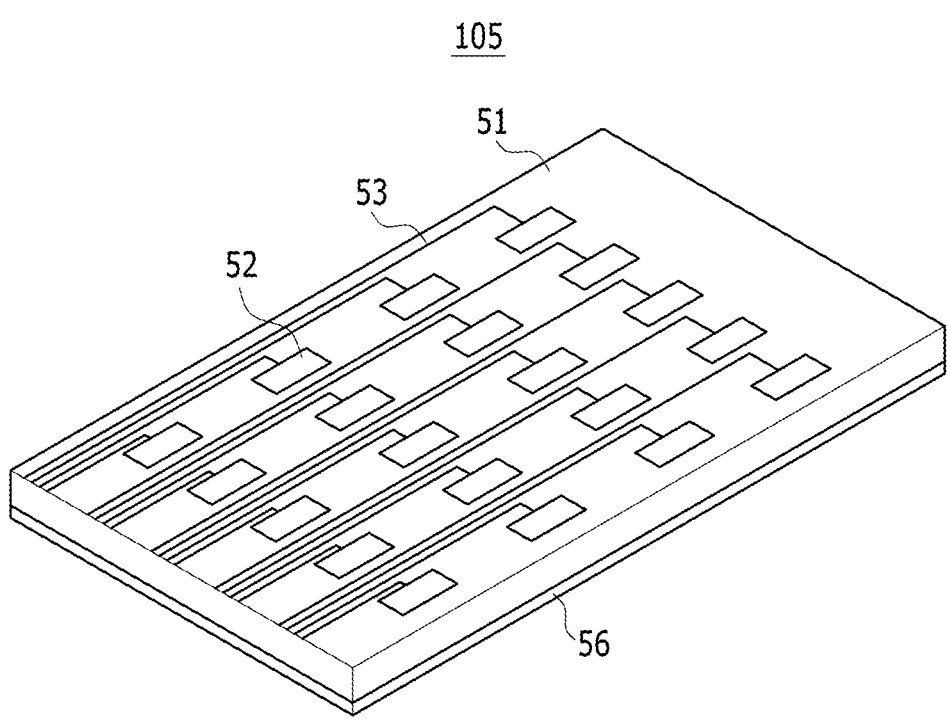
FIG. 8 is a perspective view showing an image sensor according to a fifth exemplary embodiment of the present invention.
Figure 9:
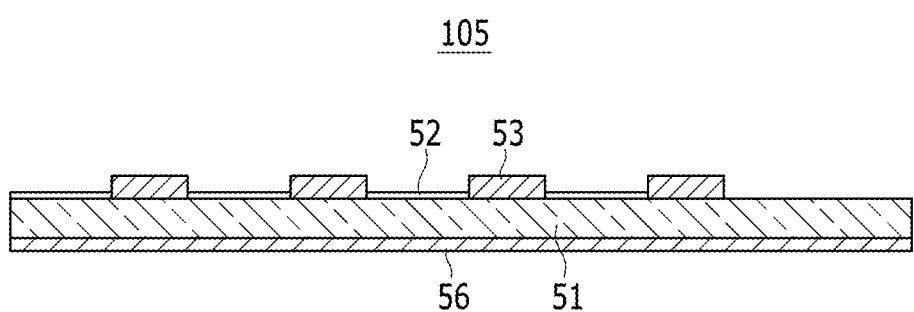
FIG. 9 is a cross-sectional view showing the image sensor according to the fifth exemplary embodiment of the present invention.

FIG. 8 is a perspective view showing an image sensor according to a fifth exemplary embodiment of the present invention, and FIG. 9 is a cross-sectional view showing the image sensor according to the fifth exemplary embodiment of the present invention.

Referring to FIGS. 8 and 9, an image sensor 105 according to the present exemplary embodiment includes a substrate 51, a plurality of plasmonic nanostructures 52 formed on the substrate 51, and a first electrode 53 and a second electrode 56 provided to be connected to the substrate 51.

The substrate 51 may be formed of a silicon wafer. The first electrode 53 and the second electrode 56 may be formed of a metal having high conductivity, such as gold, silver, and copper. The first electrode 53 is formed in a line form on a first surface of the substrate and is disposed to be adjacent to each plasmonic nanostructure 52.

The second electrode 56 is formed on a second surface of the substrate 51, which faces an opposite direction to the first surface of the substrate 51. The second electrode 56 is applied on the entire second surface of the substrate 51 and has a surface shape. In the present exemplary embodiment, when the first electrode 53 and the second electrode 56 are formed on different surfaces of the substrate 51, a change in resistance in a thickness direction of the substrate 51 may be measured.

The plasmonic nanostructure 52 has a hexahedral shape. A plurality of plasmonic nanostructures 52 are disposed on the entire surface of the substrate 51 to be spaced apart from each other at regular intervals.

As described above, according to the present exemplary embodiment, the image sensor having a plurality of plasmonic nanostructures 52 may be embodied. The image sensor 105 reconstitutes information about a resistance value of the substrate 51 changed according to the intensity of incident light to generate image information.

As described above, since the image sensor 105 according to the present exemplary embodiment generates image information according to a change in resistance instead of a change in current, image information is capable of being more quickly renewed. Since the change in resistance due to a plasmon resonance is sensitive to light as compared to a change in photocurrent, image information is capable of being precisely generated even in a dark place.

While this invention has been described in connection with what is presently considered to be practical exemplary embodiments, it is to be understood that the invention is not limited to the disclosed embodiments, but, on the contrary, is intended to cover various modifications and equivalent arrangements included within the scope of the appended claims, detailed description of the invention, and drawings.

DESCRIPTION OF SYMBOLS

101, 102, 103, 104: photodetector
105: image sensor
12: base
13, 31, 41, 51, 62: substrate
21, 32, 42, 52, 61: plasmonic nanostructure
23, 34, 44, 53, 63: first electrode
24, 35, 45, 56, 64: second electrode
25: plasmonic nanoparticle
26: measuring device

What is claimed is:
1. A photodetector comprising:
an electrically conductive substrate;
a first electrode formed on the substrate;
a second electrode formed on the substrate, and disposed to be spaced apart from the first electrode;
a plasmonic nanostructure disposed on the substrate, and positioned between the first electrode and the second electrode and having surface plasmon resonance; and
a resistance measuring device or an electrical conductivity measuring device connected to the first electrode and the second electrode,
wherein the plasmonic nanostructure comprises a plurality of metal plasmonic nanoparticles having a shape of hexahedron, a cylinder, a rod, a disk, a pillar, or a ring.
2. The photodetector of claim 1, wherein the plasmonic nanostructure causes surface plasmon resonance when light is incident, and changes electrical conductivity of the substrate according to the surface plasmon resonance.

3. The photodetector of claim 2, wherein the photodetector is a field effect transistor controlling a flow of a current by light incident on the plasmonic nanostructure.

4. The photodetector of claim 2, wherein a heterogeneous doping region on which a material that is different from a doping material forming the substrate is doped is formed at a portion adjacent to the first electrode and the second electrode.

5. The photodetector of claim 2, wherein an insulating thin film is formed between the plasmonic nanostructure and the substrate.

6. The photodetector of claim 2, wherein the substrate is formed of a conductive metal oxide.

7. The photodetector of claim 2, wherein the substrate is a silicon on insulator (SOI) substrate.

8. The photodetector of claim 1, wherein the plasmonic nanostructure has any one structure of hexahedron type, cylinder type, rod type, and ring type structures.

9. An image sensor comprising a plurality of photodetectors according to any one of claims 1.

10. The photodetector of claim 2, wherein as an aspect ratio of the plasmonic nanostructure increases, a wavelength of the surface plasmon resonance increases.

* * * * *